United States Patent [19]

Glovatsky et al.

[11] Patent Number: 5,754,398
[45] Date of Patent: May 19, 1998

[54] CIRCUIT-CARRYING AUTOMOTIVE COMPONENT AND METHOD OF MANUFACTURING THE SAME

[75] Inventors: Andrew Z. Glovatsky, Ypsilanti; Alice Zitzmann, Belleville, both of Mich.

[73] Assignee: Ford Motor Company, Inc., Dearborn, Mich.

[21] Appl. No.: 654,489

[22] Filed: May 28, 1996

[51] Int. Cl.⁶ .................................................. H05K 7/20
[52] U.S. Cl. .......................... 361/690; 29/856; 264/249; 361/719; 454/184
[58] Field of Search .................................. 361/749, 784, 361/789, 627, 690–695, 704, 707, 713, 790, 717–719; 454/184; 248/27.1; 165/80.3; 307/10.1; 29/739, 522.1, 526.3, 841, DIG. 29, 854–856; 264/272.11, 272.15, 272.17, 275, 249; 296/70; 180/90; 174/52.2, 52.4

[56] References Cited

U.S. PATENT DOCUMENTS

| | | | |
|---|---|---|---|
| 3,635,305 | 1/1972 | Kunishi | 180/90 |
| 4,479,915 | 10/1984 | Tsubouchi | 264/249 |
| 4,882,657 | 11/1989 | Braun | 361/784 |
| 4,901,204 | 2/1990 | Hayashi | 361/784 |
| 4,942,499 | 7/1990 | Shibata | 361/428 |
| 5,220,488 | 6/1993 | Denes . | |
| 5,442,518 | 8/1995 | Beam | 361/690 |
| 5,489,801 | 2/1996 | Blish, II | 257/675 |
| 5,538,586 | 7/1996 | Swanson | 29/841 |

*Primary Examiner*—Gerald P. Tolin
*Attorney, Agent, or Firm*—Raymond L. Coppiellie

[57] ABSTRACT

A circuit-carrying automotive component and a method of manufacturing the same are provided. In a preferred embodiment of the invention, the component includes a substrate made from a polymer that is molten at a predetermined elevated temperature. The component further includes a circuit board which defines an aperture therethrough adapted to receive the molten polymer at the elevated temperature and a fastener formed from the molten polymer through the aperture. The fastener is integral with the substrate and mechanically secures the circuit board to the substrate. The circuit board is made from a material that is resistant to fusing with the molten polymer at the elevated temperature.

14 Claims, 3 Drawing Sheets

CIRCUIT-CARRYING AUTOMOTIVE COMPONENT AND METHOD OF MANUFACTURING THE SAME

BACKGROUND OF THE INVENTION

1. Field of the Invention

The present invention relates to the manufacture of a circuit-carrying automotive component in which a circuit board is mechanically secured to a polymeric substrate during the formation of the substrate.

2. Description of Related Art

U.S. Pat. No. 5,220,488 describes a method for producing a molded printed circuit package wherein a flexible plastic film printed with an electrically conductive trace material is fused to an injection molded substrate material in an injection molding tool. Because the film and the substrate are fused together, this method requires the use of chemically compatible film and substrate materials, limiting design flexibility. Design flexibility is further limited by the need to ensure that materials having compatible thermal expansion coefficients are used. Otherwise, thermal cycling may subject the fused interface to excessive stress.

SUMMARY OF THE INVENTION

The present invention provides a circuit-carrying automotive component and a method of manufacturing the same which overcome the limitations of the prior art. The manufacturing method involves integrally molding a circuit board to a polymeric substrate and includes the step of providing a mold tool having a first mold member defining a first mold surface and a second mold member defining a second mold surface. A circuit board having first and second surfaces is also provided and is positioned between the mold members such that at least a portion of the first surface of the circuit board is juxtaposed the first mold surface. The method further includes the step of moving the mold members to a closed position to define a mold cavity therebetween, wherein an attachment region is further defined between at least one of the mold members and the circuit board. A molten resin is introduced into the mold cavity at a temperature below that which would fuse the resin to the circuit board, and the resin flows throughout the cavity and into the attachment region. The substrate and a fastener integral with the substrate are formed by hardening the resin. The fastener is formed in the attachment region and mechanically secures the circuit board to the substrate.

A circuit-carrying automotive component according to the present invention includes a substrate made from a polymer that is molten at an elevated temperature and a circuit board having an aperture therethrough adapted to receive the molten polymer at the elevated temperature. The component further includes a fastener formed from the molten polymer through the aperture. The fastener is integral with the substrate and mechanically secures the circuit board to the substrate. The circuit board is made from a material that is resistant to fusing with the molten polymer at the elevated temperature.

According to one aspect of the present invention, the fastener is configured to releasably secure the circuit board to the substrate.

According to another aspect of the present invention, the substrate includes a flexible region having a reduced cross-section around the periphery of the circuit board to permit movement of the substrate relative to the circuit board.

It is an advantage of the present invention to provide a method wherein a circuit board may be integrally molded to a substrate yet remain readily removable from the substrate.

It is a further advantage of the present invention that the circuit board and the substrate need not be made from chemically compatible materials or materials having similar coefficients of thermal expansion.

These and other features and advantages of the present invention will be more fully described below with reference to the following detailed description and drawings.

DETAILED DESCRIPTION OF THE PREFERRED EMBODIMENTS

Figure 1:
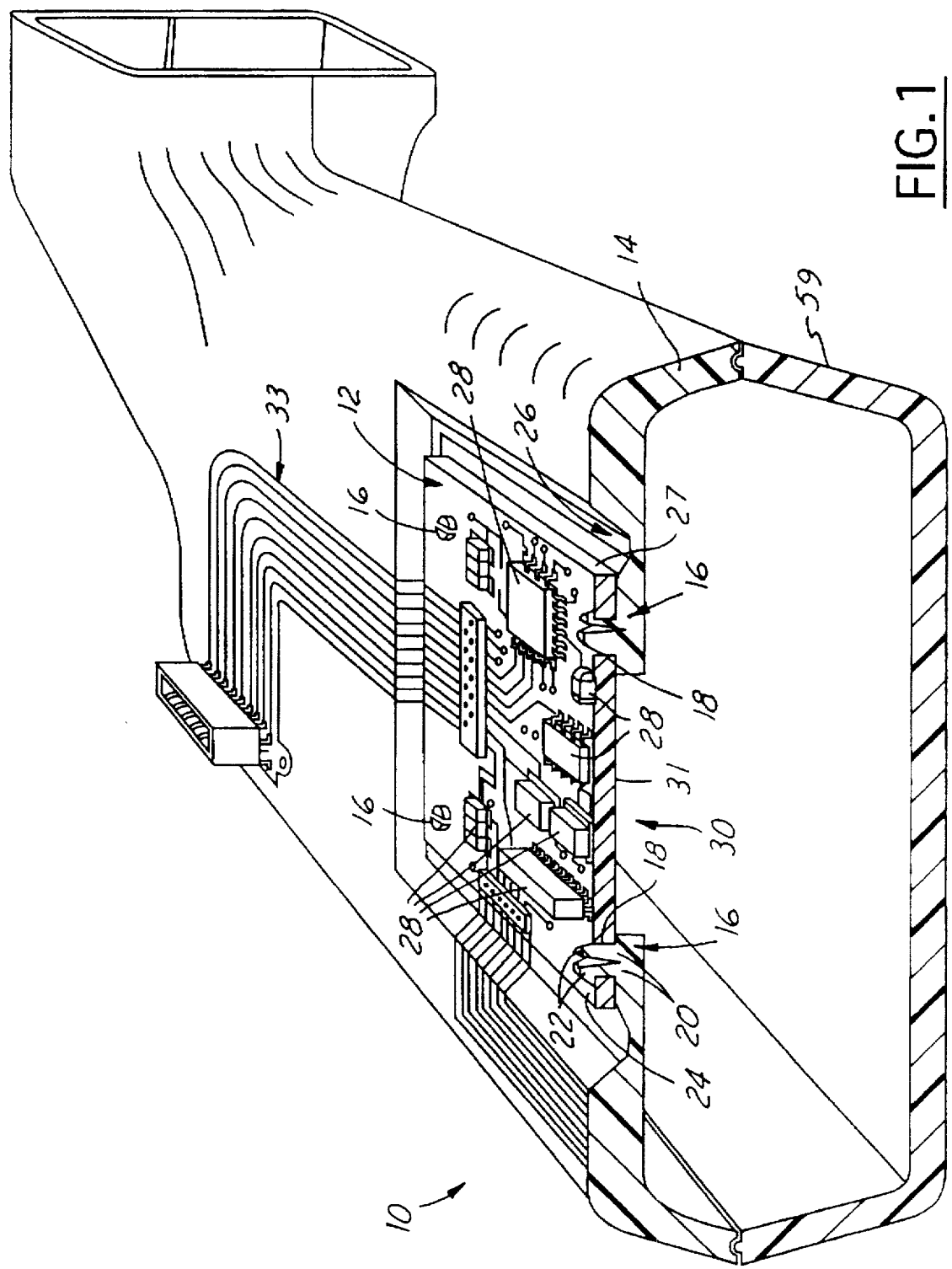
FIG. 1 is a perspective view, shown in partial section, of a circuit-carrying automotive component according to the present invention.

Turning now to the drawings, and in particular to FIG. 1 thereof, a circuit-carrying automotive component 10 is illustrated as comprising a circuit board 12 mechanically secured to a polymeric substrate 14 by means of fasteners 16. As will be described more fully below, fasteners 16 are formed through apertures 18 in circuit board 12. For illustration purposes, automotive component 10 is depicted in FIG. 1 as a two-piece ventilation duct, with substrate 14 comprising one wall of the duct. Those skilled in the automotive arts will understand, however, that component 10 may advantageously comprise various other automotive structures such as, for example, a door panel, an instrument panel, or a package tray.

Materials for circuit board 12 and substrate 14 are selected such that the substrate material is molten at a temperature below that which would cause degradation of the circuit board material or fusing of the two materials. As used herein, the term fusing refers to the intermingling of materials, one into the other. Other than the above requirement, the optimal materials for substrate 14 and circuit board 12 may be selected independently of one another, based on the particular cost, weight and performance objectives of each.

Circuit board 12 is preferably made from a conventional electronic grade material. Such materials are well-known in the art and include, for example, thermosets such as FR-4, FR-2, CEM-1 and CEM-2. These materials are capable of withstanding high temperature soldering and curing operations as well as exposure to various circuit-processing chemicals including etchants, solvents and plating compounds. Moreover, these materials have relatively low thermal expansion coefficients of about 12–25 ppm/°C. These thermal expansion coefficients generally correspond to the thermal expansion coefficients of the metal pins, circuit traces, solder pads and electronic components mounted to the circuit board.

Substrate 14 is made from a polymer that is molten at a predetermined elevated temperature. Both thermosetting and thermoplastic materials are suitable for use with the present invention, though thermoplastic materials commonly used in automotive applications such as acrylonitrile-butadiene-styrene copolymer (ABS) and polypropylene (PP) are preferred. Other suitable substrate materials include, but are not limited to, polyethylene, polystyrene, polyphenylene oxide, nylon, polyethylene terephthalate, polyetherimide and polyimide. Fillers, such as glass or talc, may be added to any of the above-mentioned substrate materials.

It is an advantage of the present invention that substrates having relatively high coefficients of thermal expansion may be used with circuit boards having relatively low thermal expansion coefficients. The thermal expansion coefficients of unfilled ABS and PP, for example, are greater than 80 ppm/°C. Coefficient of thermal expansion differences can be accommodated in the present invention because circuit board 12 and substrate 14 are mechanically secured to one another in selected regions, rather than being fused together.

One preferred fastener configuration for mechanically securing circuit board 12 to substrate 14 is illustrated in FIG. 1. Each of the fasteners 16 is integral with substrate 14 and comprises a pair of spaced apart, resilient members 20. Resilient members 20 permit movement of substrate 14 relative to circuit board 12 due to thermal expansion without causing damage to the substrate, the circuit board or the electronic circuitry. Resilient members 20 also permit the selective removal of circuit board 12 from substrate 14. Such removal may be accomplished by simply pressing members 20 together such that the hooked ends 22 of members 20 release the first surface 24 of circuit board 12. Members 20 may then freely pass through the apertures 18 in circuit board 12.

Means for resisting thermal warpage of automotive component 10 due to thermal expansion differences between circuit board 12 and substrate 14 are also advantageously provided around the periphery of circuit board 12. In the illustrated embodiment of the present invention, such means include a flexible strain relief region 26 of substrate 14 having a reduced cross-section. Substrate 14 does not contact peripheral edges 27 of circuit board 12 in region 26 and is sufficiently flexible to permit movement of substrate 14 relative to circuit board 12 without causing damage to the substrate, the circuit board or the electronic circuitry thereon.

As illustrated in FIG. 1, the first surface 24 of circuit board 12 is preferably populated with various electronic components 28, such as power transistors, microprocessors, and the like. An opening 30 is provided in substrate 14, such that the second surface 31 of circuit board 12 located opposite components 28 is in fluid communication with the ventilation duct. Air flowing through the duct is therefore able to transfer heat away from components 28. If desired, a metal plate or heat sink (not shown) may be attached to surface 31 of circuit board 12 opposite components 28 to facilitate this heat transfer. Circuit board 12 preferably has a thickness of between about 0.010 and 0.10 inch, and thermal vias (not shown) may be used to interconnect surfaces 24, 31. Of course, any thermal vias provided in circuit board 12 should be sealed to prevent leakage of air from the duct. Conventional interconnection means, such as flexible circuit 33, may be used to electrically interconnect circuit board 12 to substrate 14.

Figure 2:
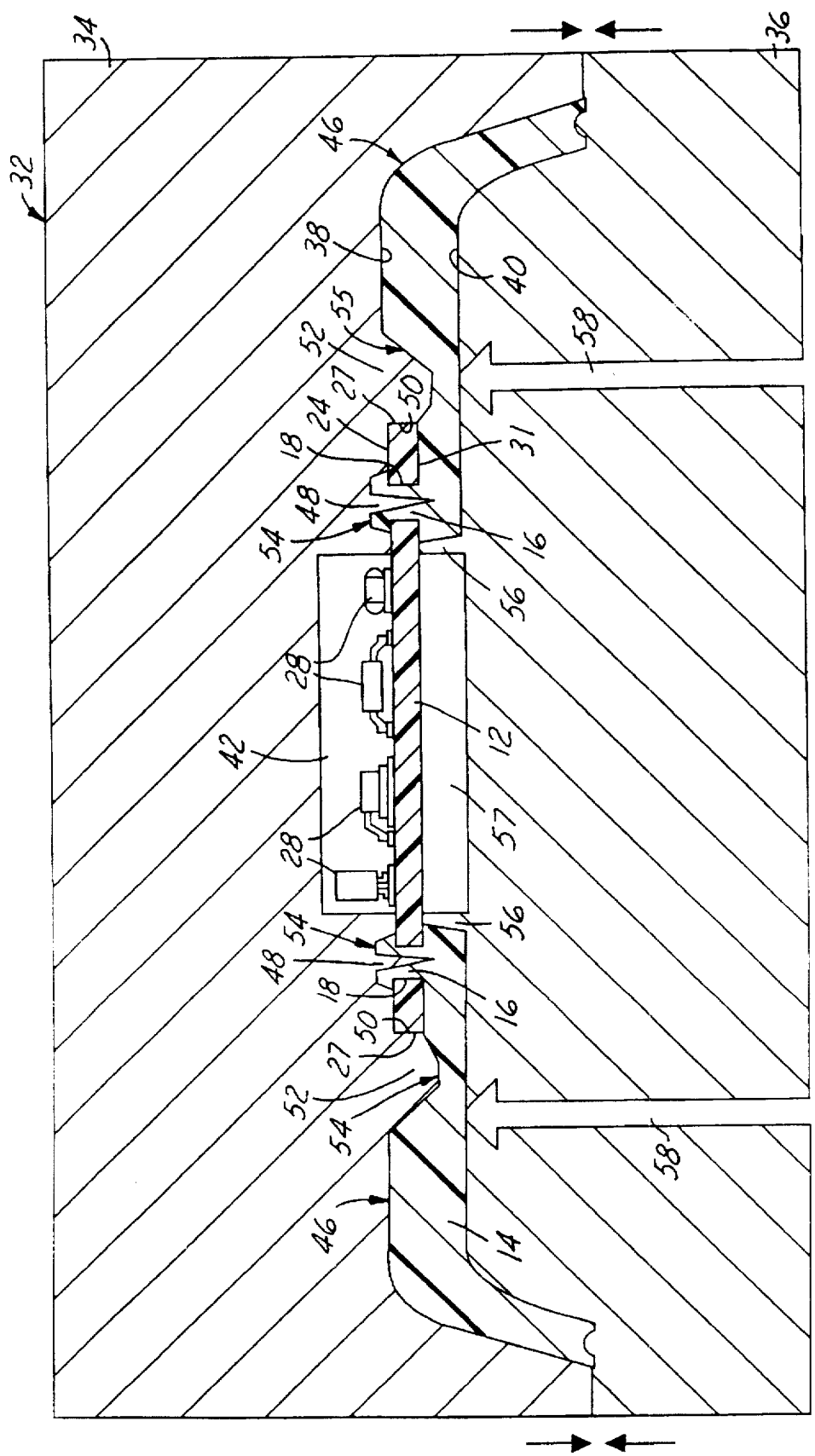
FIG. 2 is a sectional view of the component of FIG. 1, shown during the manufacture thereof.

With reference now to FIG. 2, a method of manufacturing automotive component 10 will be described. The method includes the step of providing a mold tool 32 for integrally molding substrate 14 to circuit board 12. Mold tool 32 comprises opposable mold members 34, 36, which define mold surfaces 38 and 40, respectively. Conventional means, such as an electric or hydraulic press (not shown) may be used to move mold members 34, 36 between open and closed positions.

In the open position, mold members 34, 36 are adapted to receive circuit board 12 therebetween. Circuit board 12 is positioned between mold members 34, 36 such that at least a portion of surface 24 of circuit board 12 is juxtaposed mold surface 38. Conventional retaining means, such as pins (not shown), may be used to hold circuit board 12 in position. One or both surfaces 24, 31 of circuit board 12 may be populated with electronic components 28 prior to the molding process. Where surface 24 of circuit board 12 is populated with electronic components 28, as shown in FIG. 2, corresponding mold surface 38 of mold member 34 will include at least one recess 42 to receive them. The step of positioning circuit board 12 between mold members 34, 36 includes positioning electronic components 28 within recess 42. In the embodiment of the present invention illustrated in FIG. 2, the step of positioning circuit board 12 further includes positioning apertures 18 in circuit board 12 such that the apertures are bifurcated by conical projections 48 provided on mold surface 38. The step of positioning circuit board 12 also includes positioning the periphery of circuit board 12 adjacent edge 50 of projecting portion 52 of mold surface 38. As illustrated in FIG. 2, edge 50 is configured to closely conform to the periphery of circuit board 12.

Once circuit board 12 is properly positioned, mold members 34, 36 are moved in the direction indicated by the arrows in FIG. 2 to a closed position. In the closed position, mold members 34, 36 cooperate to define a mold cavity 46 therebetween. Within mold cavity 46, attachment regions 54 are further defined between mold members 34, 36 and each of the apertures 18 in circuit board 12. Projecting portion 52 of mold member 34, in cooperation with mold member 36, defines a reduced cross-section 55 in mold cavity 46 around the periphery of circuit board 12. Moving mold members 34, 36 to a closed position also brings raised portions 56 of mold member 36 into contact with surface 31 of circuit board 12. Raised portions 56 define a region 57 therebetween, located opposite electronic components 28, in which mold surface 40 is spaced apart from surface 31.

Substrate 14 and fasteners 16 are molded within mold tool 32 by introducing a molten resin into cavity 46 through one or more sprues 58. The resin flows throughout cavity 46 and into attachment regions 54. In the attachment regions, the resin contacts each of the molding surfaces 38, 40 as well as circuit board 12. Raised portions 56 of mold member 36 seal against surface 31 of circuit board 12, preventing the resin from flowing into region 57 and contacting the circuit board there. Similarly, juxtaposed circuit board and mold member surfaces 24, 38 seal against one another preventing resin from flowing into recess 42 and encapsulating components 28. The section of circuit board 12 located between recess 42 and region 57 is thereby insulated from the molding pressure, which in injection molding applications, may be as high as about 10,000 psi. During the molding process, the temperature of the molten resin is maintained below that which would fuse the resin to circuit board 12 or cause damage to circuit board 12. For example, molding temperatures of between about 100° C. and 200° C. are commonly used in the injection molding of ABS and PP resins. A circuit board made of FR-4 would not fuse with the resin or degrade at these temperatures under normal molding pressures and cycle times.

Substrate 14 and fasteners 16 are formed by hardening the resin, which for thermoplastic resins is accomplished by cooling the resin. As illustrated in FIG. 2, fasteners 16 are formed through apertures 18 in attachment regions 54. The fasteners thus formed are integral with substrate 14, meaning that they are molded coextensively therewith, and mechanically secure circuit board 12 to substrate 14. An advantage of molding circuit board 12 to substrate 14 as taught herein is that relatively complex fastener shapes, such as that illustrated in FIG. 2, may be produced with relatively simple mold tools. If the same fastener 16 were to be molded in a tool without circuit board 12, die lock would be an issue, and retractable slides would likely be needed to permit removal of the molded part from the tool. Another advantage of molding circuit board 12 to substrate 14 as taught herein is that a sealing fit may be readily and reliably achieved between fasteners 16 and apertures 18. Fasteners 16 are therefore able to prevent air flowing through the ventilation duct from leaking through apertures 18. As further illustrated in FIG. 2, flexible strain relief region 26 of substrate 14 is formed by hardening the resin within the reduced cross-section 55 of mold cavity 46. Opening 30 in substrate 14, on the other hand, is created in region 57.

Following its removal from mold tool 32, substrate 14 is joined to the other wall 59 of the ventilation duct (see FIG. 1), in conventional fashion. At this time, additional electronic components may be added to circuit board 12, if desired.

Figure 3:
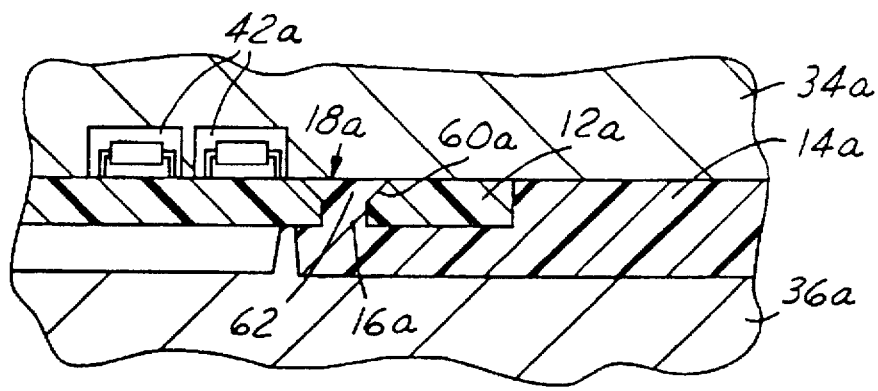
FIGS. 3–5 are sectional views of alternative embodiments of circuit-carrying automotive components according to the present invention, illustrating various fastener configurations.
Figure 4:
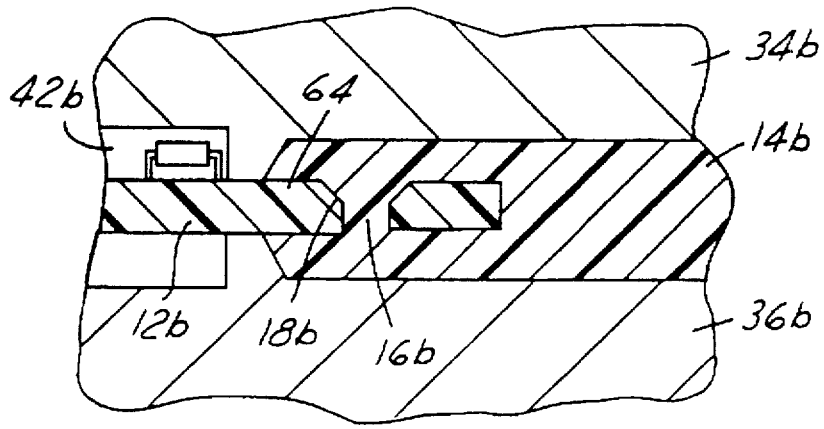
Figure 5:
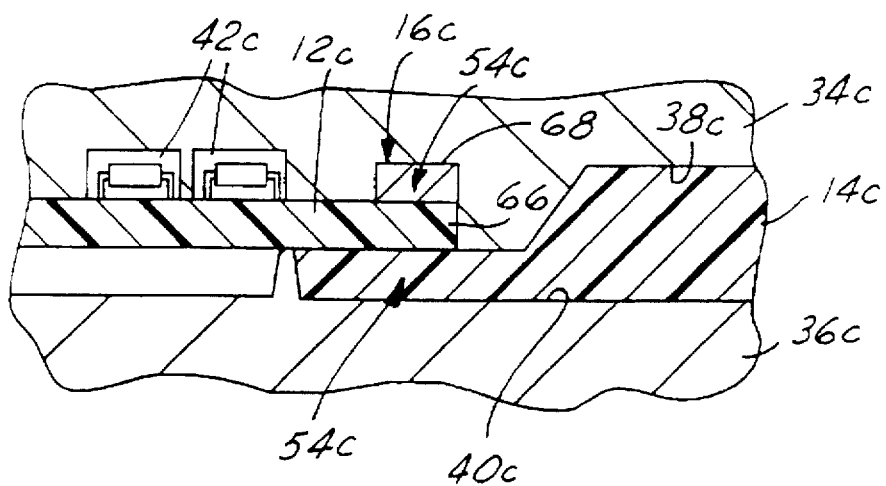

Turning now to FIGS. 3–5 alternative embodiments of automotive component 10 are illustrated. Each of these embodiments depicts a different fastener configuration. In FIG. 3, for example, aperture 18a includes a frustroconical portion 60a. Fastener 16a formed within aperture 18a therefore includes a corresponding frustroconical portion 62. Frustroconical portion 62 of fastener 16a prevents circuit board 12a from being removed from substrate 14a following its attachment thereto. Fastener 16b of FIG. 4 is similar to fastener 16a except that the end 64 of circuit board 12b adjacent aperture 18b is completely encapsulated by substrate 14b.

In FIG. 5, circuit board 12c does not include an aperture therethrough for receiving fastener 16c. Instead fastener 16c surrounds or sandwiches a portion of circuit board 12c, such as end 66. To form fastener 16c, circuit board 12c is positioned such that end 66 is spaced apart from mold surface 38c. This may be accomplished by providing an indentation 68 within mold surface 38c. In moving mold members 34c, 36c to a closed position, mold surface 40c is also spaced apart from end 66, such that attachment region 54c is defined between end 66 and both mold surfaces 38c, 40c. In other respects, the method of molding circuit board 12c to substrate 14c is similar to the method described above with reference to FIGS. 1 and 2.

While the invention has been shown and described in its preferred embodiments, it will be clear to those skilled in the arts to which it pertains that many changes and modifications may be made thereto without departing from the scope of the invention. For example, while mold tool 32 is illustrated herein as an injection molding tool, the method of forming substrate 14 is not limited to injection molding. Other suitable forming methods include, but are not limited to, compression molding, low pressure compression molding, and blow molding. These and other modifications which fall within the true scope of this invention are intended to be included within the terms of the appended claims.

What is claimed is:

1. A method of manufacturing a circuit-carrying automotive component in which a circuit board is integrally molded to a polymeric substrate, the method comprising the steps of:

providing a mold tool having a first mold member defining a first mold surface and a second mold member defining a second mold surface;

providing a circuit board having first and second surfaces;

positioning the circuit board between the mold members such that at least a portion of the first surface of the circuit board is juxtaposed the first mold surface;

moving the mold members to a closed position to define a mold cavity therebetween, wherein an attachment region is further defined between at least one of the mold members and the circuit board;

introducing a molten resin into the mold cavity at a temperature below that which would fuse the resin to the circuit board, the resin flowing throughout the cavity and into the attachment region; and forming the substrate and a fastener integral with the substrate by hardening the resin, the fastener being formed in the attachment region and mechanically securing the circuit board to the substrate.

2. The method of claim 1, wherein said forming step comprises cooling the resin.

3. The method of claim 1, wherein the circuit board includes an aperture therein, the aperture and at least one of the mold members define the attachment region, and said forming step further includes forming the fastener within the aperture.

4. The method of claim 3, wherein the first mold surface includes a projection, said step of positioning the circuit board includes positioning the projection within the aperture such that the aperture is bifurcated by the projection, and the fastener formed within the aperture includes a pair of spaced apart members releasably securing the circuit board to the substrate.

5. The method of claim 1, wherein said step of positioning the circuit board includes positioning the circuit board such that an end thereof is spaced apart from the first mold surface, and wherein said step of moving the mold members to a closed position includes spacing the second mold surface from the end of the circuit board, the attachment region being defined between the end of the circuit board and both mold surfaces such that the fastener formed in the attachment region surrounds the end of the circuit board.

6. The method of claim 1, wherein the first mold surface includes a projecting portion having an edge which conforms to the periphery of the circuit board, said step of positioning the circuit board includes positioning the circuit board periphery adjacent the edge of the projecting portion, and said step of moving the mold members to a closed position includes defining a reduced cross-section in the mold cavity around the periphery of the circuit board, thereby permitting the formation of a corresponding reduced cross-section in the substrate.

7. The method of claim 1, wherein the first surface of the circuit board has an electronic component mounted thereon and the first mold surface has a recess for receiving the electronic component, said step of positioning the circuit board further including positioning the electronic component within the recess.

8. A method of manufacturing a circuit-carrying automotive component in which a circuit board is integrally molded to a polymeric substrate, the method comprising the steps of:

providing a mold tool having a first mold member defining a first mold surface and a second mold member defining a second mold surface;

providing a circuit board having first and second surfaces and an aperture therethrough;

positioning the circuit board between the mold members such that at least a portion of the first surface of the circuit board is juxtaposed the first mold surface;

moving the mold members to a closed position to define a mold cavity therebetween, wherein an attachment region is further defined between at least one of the mold members and the circuit board;

introducing a molten resin into the mold cavity at a temperature below that which would fuse the resin to the circuit board, the resin flowing throughout the cavity and into the circuit board aperture; and cooling the resin to form the substrate, the resin in the aperture forming a fastener integral with the substrate, the fastener mechanically securing the circuit board to the substrate.

9. A circuit-carrying automotive component, comprising:

a substrate made from a polymer that is molten at an elevated temperature, said substrate comprising a wall of a ventilation duct;

a circuit board made from a material that is resistant to fusing with said molten polymer at said elevated temperature, said circuit board defining an aperture therethrough adapted to receive said molten polymer at said elevated temperature; and a fastener formed from the molten polymer through said aperture, said fastener being integral with said substrate and mechanically securing said circuit board to said substrate.

10. The component of claim 9, wherein said circuit board comprises a thermoset material and said substrate comprises a thermoplastic.

11. The component of claim 9, wherein said fastener comprises a pair of spaced apart, resilient members releasably securing said circuit board to said substrate.

12. The component of claim 9, wherein said aperture has a frustroconical portion.

13. The component of claim 9, wherein said substrate includes a flexible region having a reduced cross-section around the periphery of said circuit board.

14. The component of claim 9, wherein said circuit board includes a first surface having an electronic component mounted thereon and a second surface which is in fluid communication with the ventilation duct at a location opposite said electronic component.

* * * * *